(12) United States Patent
Thallner

(10) Patent No.: US 7,998,833 B2
(45) Date of Patent: Aug. 16, 2011

(54) METHOD FOR BONDING WAFERS

(76) Inventor: Erich Thallner, Florian (AT)

( * ) Notice: Subject to any disclaimer, the term of this patent is extended or adjusted under 35 U.S.C. 154(b) by 0 days.

(21) Appl. No.: 12/496,799

(22) Filed: Jul. 2, 2009

(65) Prior Publication Data

US 2009/0298207 A1 Dec. 3, 2009

Related U.S. Application Data

(62) Division of application No. 11/053,976, filed on Feb. 9, 2005, now Pat. No. 7,598,152.

(30) Foreign Application Priority Data

Feb. 13, 2004 (DE) .......................... 10 2004 007 060

(51) Int. Cl.
*H01L 21/30* (2006.01)
*H01L 21/46* (2006.01)

(52) U.S. Cl. ......... 438/455; 257/E27.137; 257/E27.144; 257/E27.161; 257/E21.53; 257/E21.088

(58) Field of Classification Search .................. 438/16, 438/455; 257/676, 678, 738, E27.137, E27.144, 257/E27.161, E21.53, E21.088
See application file for complete search history.

(56) References Cited

U.S. PATENT DOCUMENTS

| | | | |
|---|---|---|---|
| 4,962,062 A | 10/1990 | Uchiyama et al. | 437/225 |
| 5,236,118 A * | 8/1993 | Bower et al. | 228/193 |
| 5,500,540 A * | 3/1996 | Jewell et al. | 257/82 |
| 5,569,960 A | 10/1996 | Kumazawa et al. | 257/738 |
| 6,010,591 A | 1/2000 | Gösele | 156/281 |
| 6,093,577 A * | 7/2000 | van der Groen et al. | 438/30 |
| 6,180,496 B1 | 1/2001 | Farrens et al. | 438/455 |
| 6,320,639 B1 | 11/2001 | Mori et al. | 349/155 |
| 2002/0134503 A1* | 9/2002 | Hussinger et al. | 156/331.4 |
| 2003/0045044 A1 | 3/2003 | Dentry et al. | 438/200 |
| 2003/0122141 A1 | 7/2003 | Wong et al. | 257/88 |

FOREIGN PATENT DOCUMENTS

| | | |
|---|---|---|
| EP | 0886306 | 12/1998 |
| EP | 1278245 | 1/2003 |
| EP | 1 650 791 | 4/2006 |
| WO | WO 2004/010481 | 1/2004 |

OTHER PUBLICATIONS

Article entitled: "Schutzkappe für Mikrosysteme," Hans-Ulrich Ehrke, F&M, Issue 107, 1999, pp. 74-76. {*English Abstract translation is attached*}.
"SB6/8e Semi-Automated Wafer Bonding System, Precision Wafer Bonding Solution," http://www.suss.com/products/wafer_bonder/semi_automated_wafer_bonders/sb6-8e, accessed May 19, 2008.

* cited by examiner

*Primary Examiner* — A. Sefer
*Assistant Examiner* — Monica D Harrison
(74) *Attorney, Agent, or Firm* — Kusner & Jaffe

(57) ABSTRACT

The invention relates to a method for bonding wafers along their corresponding surfaces.

13 Claims, 1 Drawing Sheet

METHOD FOR BONDING WAFERS

RELATED APPLICATIONS

This application is a divisional of U.S. application Ser. No. 11/053,976, filed Feb. 9, 2005, now U.S. Pat. No. 7,598,152 and is hereby fully incorporated herein by reference.

FIELD OF THE INVENTION

The invention relates to a device and a method for bonding wafers.

BACKGROUND OF THE INVENTION

Various key technologies have been developed for bonding wafers or wafer surfaces and are now sufficiently known in the prior art. These include: aligned wafer bonding; front-to-backside photolithography; and customized resist coating.

The present invention primarily relates to aligned wafer bonding in which various methods can in turn be used. These are also described comprehensively in the literature. They include among others: anodic/electrostatic bonding of silicon on glass; low-temperature glass frit bonding of silicon on silicon; and direct wafer bonding (DWB) or fusion bonding.

Further methods are eutectic bonding, epoxy bonding, thermo-compression bonding and glass-on-glass bonding.

In this case, the methods described in the prior art for aligned wafer bonding always consist of the following two separate and different steps. The two wafers arranged one above the other are first aligned with the aid of an alignment device with an accuracy of +/−1 μm, wherein the surfaces of the two wafers which are to be bonded, lie opposite to one another. In this first step it is necessary to maintain a separation distance between the two surfaces to be bonded. In the prior art this is mostly accomplished by spacers which are distributed on the circumferences of the wafers, with the smallest possible surface being covered by these. However, in order to ensure a stable hold, at least three such spacers are required.

The two wafers are then placed under vacuum in a vacuum chamber after which the two previously aligned wafers are brought in contact by means of a computer control system and are joined or bonded by one of the methods described above. For contacting the spacers arranged on the circumferences are withdrawn uniformly so that the previously aligned spacers do not slip any more.

The hitherto known methods for aligned wafer bonding consequently have two important disadvantages. Firstly, gaps are formed by the spacers in the contact surface and on the other hand, during contacting by withdrawing the spacers there is the risk that the wafers which have previously been positioned exactly, slip relative to one another.

SUMMARY OF THE INVENTION

It is the object of the invention to provide a method and a device with which disk-shaped parts, especially semiconductor disks, can be exactly aligned and joined together in the best possible fashion.

The basic idea of the invention is to join the parts together temporarily at first. In this case, the parts are adjusted. The final joining to form a composite member then follows.

Insofar as wafer is talked about in connection with the invention, this is representative of any type of flat component to be aligned.

Said object is solved by a device for bonding wafers to corresponding surfaces of wafers, which has the following features:
 a. a unit for applying a layer of bonding agent to at least one of the surfaces of the wafers,
 b. a first device for receiving and possibly aligning a first wafer,
 c. a second device for receiving and aligning a second wafer with respect to a first wafer,
 d. a control unit effecting the following process steps one after the other:
  i. applying a layer of bonding agent to at least one of the corresponding surfaces by means of the unit,
  ii. contacting the corresponding surfaces of the wafer by means of the devices,
  iii. aligning the wafers by aligning means along the corresponding surfaces of the wafers in contact, and
  iv. bonding the corresponding surfaces by curing the bonding means.

The first device can consist of a table-like support, for example, in the fashion of a t "chuck". The table can be constructed as static or capable of rotating. The first wafer can lie directly or indirectly on the support.

A layer of bonding agent is applied to the second wafer and/or the first wafer before the second wafer is brought in contact with the first wafer. The layer can be applied to the respective wafer either as a full-surface layer or as a patterned layer.

Possible bonding agents can be adhesives, which should be selected according to the substrate of the wafer and should be sufficiently viscous in order to allow sliding of the wafers after contact of the corresponding surfaces of the wafers. Good results are achieved, for example, with UV-curable epoxy resin adhesives.

In this way a device which manages without contact pins is created from which it follows that no gaps are formed on the contact surfaces of the corresponding surfaces of the wafers. Furthermore, the device according to the invention has the advantage that a precise alignment only takes place after the corresponding surfaces of the wafers have been brought in contact. As a result, any slippage of the wafers after alignment by the alignment means can be eliminated. A substantially more accurate alignment of the two wafers is achieved whereby the quality of the wafers produced using the device according to the invention increases significantly.

In other words: a full-surface adhesion or pattern-like adhesion takes place along the corresponding surfaces of the parts to be joined (in this case: wafers), without the pattern being disturbed by imprints of pins.

The alignment means can comprise a detection device for detecting the relative position of the two wafers to be aligned with respect to one another, wherein the detection device transmits signals about the relative position of the wafers with respect to one another to the control unit by means of a first operative connection between the control unit and the detection device.

The detection device ensures the exact alignment of the wafers by detecting the relative position of the wafers, passing this on to the control unit which then aligns the wafers with respect to one another.

The detection device can be configured as contact-free, especially as optical. For example, the relative position of the wafers with respect to one another is determined by the detection device using visible and/or infrared light. For this purpose, integrated adjusting marks can be applied to the wafers. In the simplest embodiment, points, symbols or areas on the two wafers can be brought into agreement for this purpose.

An even more exact alignment is achieved if the adjusting marks are scale marks which are applied to the wafers. The scale marks have a pre-defined division from which the detection device can determine the relative position of the wafers with respect to one another. However, the scales can also be applied in any other form, for example, in the form of circles, one within the other, in the fashion of a target. Coloured image points with a certain arrangement are also feasible as adjusting marks.

Mechanical means which turn and/or displace the respective wafers can be used for alignment as soon as corresponding signals are obtained from the control unit.

The parts to be joined can consist of glass or silicon, for example.

A relevant method for bonding two wafers on two corresponding surfaces of the wafers comprises the following steps:

a. applying bonding agents to at least one of the two corresponding surfaces, b. contacting the wafers at the corresponding surfaces, c. aligning the wafers by means of sliding means along the corresponding surfaces of the wafers in contact, by bringing aligning means into agreement, and d. bonding the wafers.

In this method, the wafers can be optically aligned. A corresponding optical measuring unit is used for this purpose. The means for alignment (adjusting) can be integrated at least partly into the parts to be adjusted. At least one adjusting mark is required on each adjusting part. In process step B the wafers can be aligned at least roughly using the wafer edges. The alignment by sliding means along the corresponding surfaces of the wafers in contact can take place by rotation and/or sliding in the X-Y direction.

With reference to further embodiments for the individual process steps, reference is made to the preceding explanations in connection with the device and to the following description of the figures.

Further features of the invention are obtained from the features of the dependent claims and the other application documents.

BRIEF DESCRIPTION OF THE DRAWINGS

The invention is explained in detail hereinafter with reference to an exemplary embodiment. The features described therein can be important both individually and in any combinations for implementing the invention. This also applies to the features which were specified hereinbefore to describe the device and the method. The figures in the drawings show in detail.

DETAILED DESCRIPTION OF THE INVENTION

Figure 1:
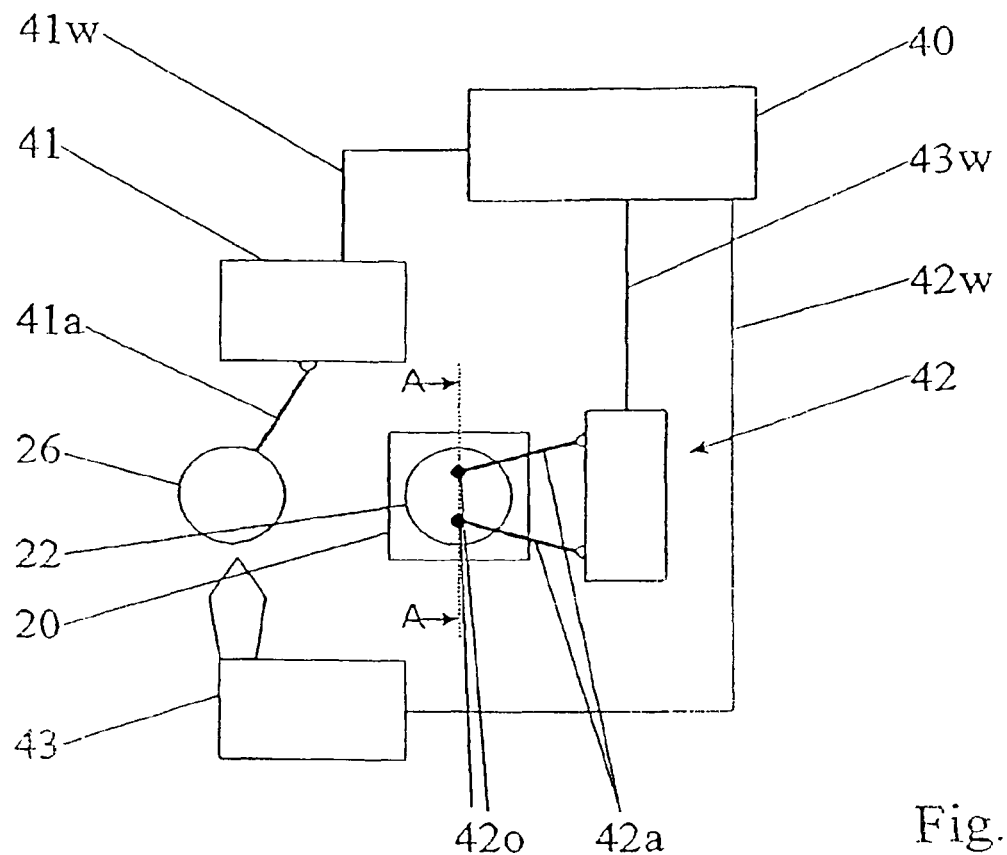
FIG. 1 is a schematic view of the device according to the invention before beginning the method according to the invention.
Figure 2:
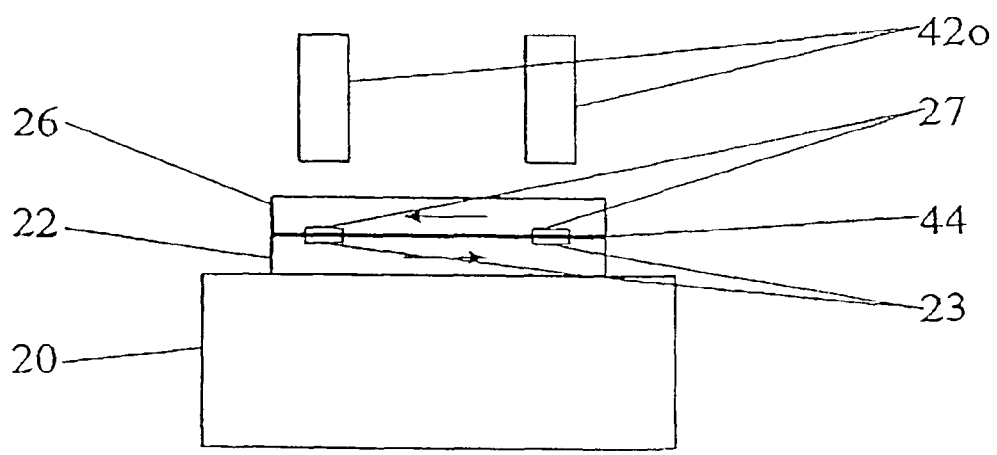
FIG. 2 is a schematic sectional view along the line of intersection A-A from FIG. 1 which shows the process step of aligning the wafers relative to one another after contacting.

FIG. 1 is a highly schematic diagram showing a control unit 40 which executes the method according to the process steps described in the above description in an exemplary embodiment of the present invention.

The control unit 40 here is connected in each case by a first, second and third operative connection 41w, 42w and 43w to a device 41 for receiving and aligning the second wafer 26, to a detection device 42 to detect the position of the wafers relative to one another and to a unit 43 for applying a bonding means 44.

The second device 41 for receiving and aligning the second wafer 26 is connected to the wafer 26 via a swiveling arm 41a to move the second wafer 26 from the unit 43 to a first device 20 for receiving the first wafer 22. The spatial arrangement of the devices with respect to one another is merely exemplary.

Grippers at the ends of the arm 41a, which are not shown, hold the second wafer 26 and are known to the person skilled in the art. It is advantageous to use contactless Bernoulli grippers.

Using the unit 43, an adhesive is applied to the second wafer 26 and/or the first wafer 22 by known methods such as spraying on, centrifuging on, printing on or other methods. The adhesive layer can be applied over the entire surface or structured, for example, by screen printing.

As soon as the bonding means (the adhesive) has been applied to one or both wafers, the corresponding surfaces of the wafers are brought in contact, by swiveling the second wafer 26 with the swiveling arm, controlled by the control unit 42, over the first wafer 22 and lowering it onto this.

As soon as the two wafers 22 and 26 are in contact, the detection device 42 detects the position of the wafers 22 and 26 relative to one another by means of at least two high-resolution objectives 42o which are connected via arms 42a to a housing of the detection device 42. For this purpose two adjusting marks 23 and 27 are integrated in each of the two wafers 22 and 26. The adjusting marks 23 and 27 can be applied to the wafers 22 and 26 or associated with these. Detection can also take place using one objective 42o. The accuracy is substantially higher however, as a result of the shorter possible distance from the adjusting marks 23 and 27, when one objective per adjusting mark 23, 27 is used. It is also possible to use merely one objective 42o and a relevant adjusting mark on each wafer 22 and 26 for detection by aligning merely using the configuration of the adjusting mark. Using more than two adjusting marks only insignificantly increases the accuracy which is why this can be dispensed with for cost reasons.

The objectives 42o are swivellably attached to the housing of the detection device 42 via arms 42a so that the objectives 42o can be brought out of the area of action of the arm 41a and the wafer 26 when the two wafers 22 and 26 are in contact.

The detection device 42 then transmits the signals to determine the relative position of the two wafers 22 and 26 relative to one another to the control unit 40 which brings about a sliding of the second wafer 26 with the aid of the device 42 according to the position of the wafers 22, 26 with respect to one another. Sliding of the two wafers 22 and 26 in contact is possible by selecting a suitable adhesive 44 which is sufficiently viscous to allow sliding by introducing a force parallel to the wafer surface. The viscosity can additionally be influenced by controlling the temperature. For alignment of the wafers 22, 26 these can be slid and/or turned.

The adjusting marks 23 and 27 are constructed as corresponding scale lines on the two wafers so that an exact adjustment with a deviation of <=500 nm is achieved with a division of the scale lines of, for example, 500 nm within the optical resolution of the objective 42o.

As soon as the adjustment has ended, the curing of the bonding agent is brought about by the control unit, this being achieved for example by means of UV light or increasing the temperature. A device for curing the bonding agent is not shown here.

Alternatively, the alignment of the two wafers 22 and 26 can also or additionally be achieved by sliding and/or rotating the device 20 to receive the first wafer 22.

The device 41 is at the same time used here as a sliding means for the alignment step according to the present invention. Nevertheless, it is also feasible to use an additional device as a sliding means which is only responsible for the exact positioning of the wafers with respect to one another. As a result, the major swiveling of the second wafer 26 can be carried out using a device which is substantially more inaccurate and therefore also cheaper.

The entire device can also be arranged in a vacuum chamber in which further usual process steps such as a pre-cleaning step or flushing with inert gas can also be integrated.

Said process steps are instigated and monitored by a control unit 40 which is connected to the individual parts of the device by control technology.

The method described here accelerates the bonding of wafers since the process step of inserting spacers between the wafers and removing these again uniformly is eliminated. The precision of the alignment is further increased because of the shorter distance of the adjusting marks from one another compared to the devices from the prior art. A further advantage compared with the prior art is that it is possible to have adhesion over the entire surface.

Having described the invention, the following is claimed:

1. A method for bonding first and second wafers on corresponding surfaces of the first and second wafers, the method effecting the following steps one after the other:
    i. applying a layer of bonding agent to at least one of the corresponding surfaces of the first and second wafers, by means of a unit for applying the bonding agent,
    ii. contacting the corresponding surface of the first wafer with the corresponding surface of the second wafer, by means of first and second devices, wherein at least one of said corresponding surfaces has the layer of bonding agent applied thereto,
    iii. aligning the second wafer with respect to the first wafer along the corresponding surfaces of the first and second wafers that are in contact, by use of aligning means, and
    iv. bonding the corresponding surfaces of the first and second wafers by curing the bonding agent.

2. The method according to claim 1, wherein the first and second wafers are optically aligned by said aligning means.

3. The method according to claim 1, wherein the aligning means are at least partly integrated in the first and second wafers.

4. The method according to claim 1, wherein the first and second wafers are aligned by at least one adjusting mark of the aligning means integrated in each wafer.

5. The method according to claim 1, wherein alignment of the first and second wafers is detected by optical detection means of the aligning means.

6. The method according to claim 1, wherein during the step of contacting the corresponding surfaces of the first and second wafers, the first and second wafers are roughly aligned using edges of the first and second wafers.

7. The method according to claim 1, wherein said step of aligning the second wafer with respect to the first wafer includes sliding at least one of said first and second wafers.

8. The method according to claim 7, wherein said sliding includes introducing a force parallel to a surface of one of said first and second wafers.

9. The method according to claim 1, wherein said step of aligning the second wafer with respect to the first wafer includes rotating at least one of said first and second wafers.

10. The method according to claim 1, wherein said step of aligning the second wafer with respect to the first wafer includes turning at least one of said first and second wafers.

11. The method according to claim 1, wherein said step of aligning the second wafer with respect to the first wafer includes swiveling at least one of said first and second wafers.

12. A method for bonding first and second wafers on corresponding surfaces of the first and second wafers, the method effecting the following steps one after the other:
    i. applying a layer of bonding agent to at least one of the corresponding surfaces of the first and second wafers, by means of a unit for applying the bonding agent,
    ii. contacting the corresponding surface of the first wafer with the corresponding surface of the second wafer directly via the layer of bonding agent applied to at least one of said corresponding surfaces, by means of first and second devices,
    iii. aligning the second wafer with respect to the first wafer along the corresponding surfaces of the first and second wafers that are in contact, by use of aligning means, and
    iv. bonding the corresponding surfaces of the first and second wafers by curing the bonding agent.

13. A method for bonding first and second wafers on corresponding surfaces of the first and second wafers, the method effecting the following steps one after the other:
    i. applying a layer of bonding agent to at least one of the corresponding surfaces of the first and second wafers, by means of a unit for applying the bonding agent, the bonding agent being sufficiently viscous in order to allow sliding of the wafers after contact of the corresponding surfaces of the first and second wafers,
    ii. contacting the corresponding surface of the first wafer with the corresponding surface of the second wafer, by means of first and second devices, wherein at least one of said corresponding surfaces has the layer of bonding agent applied thereto,
    iii. aligning the second wafer with respect to the first wafer along the corresponding surfaces of the first and second wafers that are in contact by sliding the wafers, by use of aligning means, and
    iv. bonding the corresponding surfaces of the first and second wafers by curing the bonding agent.

* * * * *

UNITED STATES PATENT AND TRADEMARK OFFICE
CERTIFICATE OF CORRECTION

| | | |
|---|---|---|
| PATENT NO. | : 7,998,833 B2 | Page 1 of 1 |
| APPLICATION NO. | : 12/496799 | |
| DATED | : August 16, 2011 | |
| INVENTOR(S) | : Erich Thallner | |

It is certified that error appears in the above-identified patent and that said Letters Patent is hereby corrected as shown below:

Title Page, Item (76) Inventor, the Applicant's Residence of "Florian (AT)", should read --St. Florian (AT)--.

Signed and Sealed this
Eighth Day of November, 2011

David J. Kappos
*Director of the United States Patent and Trademark Office*